US005767749A

United States Patent [19]

Shon et al.

[11] Patent Number: 5,767,749

[45] Date of Patent: Jun. 16, 1998

[54] MICROWAVE OSCILLATOR

[75] Inventors: Jong-Chul Shon, Suwon, Rep. of Korea; Mark Ivanovich Kouznetsov, Novgorod, Russian Federation; Sang-Gweon Kim, Suwon, Rep. of Korea

[73] Assignee: Samsung Electronics Co., Ltd., Suwon, Rep. of Korea

[21] Appl. No.: 734,035

[22] Filed: Oct. 18, 1996

(Under 37 CFR 1.47)

[30] Foreign Application Priority Data

May 5, 1996 [RU] Russian Federation ............ 96-108393

[51] Int. Cl.[6] .............................. H03B 9/10; H01J 25/50; H01J 25/56

[52] U.S. Cl. ........................... 331/86; 331/89; 315/39.51; 315/39.53; 315/39.73; 315/39.75

[58] Field of Search ................................. 331/79, 83, 86, 331/89; 315/3.5, 3.6, 39, 39.3, 39.51, 39.53, 39.63, 39.69, 39.73, 39.75

[56] References Cited

U.S. PATENT DOCUMENTS 3,274,433 9/1966 Peterson .............................. 315/39.73

3,286,125 11/1966 Lock .................................. 315/39.73

3,982,152 9/1976 Smith .................................. 331/86 X

*Primary Examiner*—David Mis

*Attorney, Agent, or Firm*—Burns, Doane, Swecker & Mathis, L.L.P.

[57] ABSTRACT

A microwave oscillator with an M-type interdigital slow wave resonator structure is disclosed. In the above oscillator, the anode has top, middle and bottom resonance discs. The top disc has downward extending vanes and defines an upper resonance chamber, while the bottom disc has upward extending vanes and defines a lower resonance chamber. The upper and lower resonance chambers is separated from each other by a middle resonance disc that has upward and downward extending vanes. An emitter is placed between the filament and the anode and emits thermions into the actuating space when it is heated by the filament. The upward extending vanes of the middle disc engage with the vanes of the top disc in the type of interdigital engagement like clasped hands. The downward extending vanes of the middle disc engage with the vanes of the bottom disc in the same manner.

12 Claims, 10 Drawing Sheets

MICROWAVE OSCILLATOR

BACKGROUND OF THE INVENTION

1. Field of the Invention

The present invention relates in general to microwave oscillators for microwave ovens and, more particularly, to a structural improvement in such microwave oscillators to let the microwave oscillators have a high operational efficiency and output while maintaining the stable operational performance under the low actuating voltage conditions.

2. Description of the Prior Art

FIGS. 1 to 3 are views showing the construction of a typical microwave oscillator. As shown in the drawings, the microwave oscillator includes a plurality of even-numbered vanes 15. The above vanes 15 radially extend from the internal surface of an anode cylinder 13 formed of, for example, a copper pipe. The vanes 15 are spaced out at regular intervals thus forming a plurality of resonance cavities for inducing microwaves. Both the anode cylinder 13 and the vanes 15 constitute the anode 16 of the oscillator.

The above oscillator also includes inside and outside strappings 15*a* and 15*b* for changing the capacitance and thereby obtaining a uniform resonance frequency. The above strappings 15*a* and 15*b* are provided on the vanes 15 such that the strappings 15*a* and 15*b* are alternately brought into contact with the upper and lower sides of the vanes 15 near the free ends of the vanes 15. In the above anode cylinder 13, a cylindrical actuating space 12 is defined inside the free ends of the radially-extending vanes 15.

Concentrically arranged inside the space 12 is a filament heater 17 that generates high temperature heat. The above filament heater 17 (hereinbelow, referred to simply as "filament") is formed by spirally coiling a sintered alloy filament of tungsten W and thorium oxide $ThO_2$.

Top and bottom end hats 20 and 21 are fixed to both ends of the filament 17, respectively. The above hats 20 and 21 prevent thermion or loss current, that does not contribute in any shape or form to the oscillation of the above oscillator, from radiating toward the central axis of the cylinder 13. The center of the bottom hat 21 is perforated to form a central hole. A central support or first cathode support 23 formed of molybdenum axially extends upward through the central hole of the hat 21 and in turn is welded to the bottom surface of the top hat 20. Welded to the bottom surface of the above bottom hat 21 at a portion beside the first support 23 is a second cathode support 25 formed of molybdenum.

The above first support 23 extends through the filament 17 and supports the top hat 20. The lower portions of the first and second cathode supports 23 and 25 also axially penetrate an insulating ceramic 27 and in turn are brought into electrical contact with first and second outside contact terminals 29 and 31, respectively. The above ceramic 27 holds the cathode of the oscillator. The above terminals 29 and 31 in turn are connected to power source terminals 30*b* and 32*b*, respectively, so the cathode supports 23 and 25 act as filament electrodes for applying electricity to the filament 17.

The above first and second contact terminals 29 and 31 are electrically connected to first and second choke coils 30 and 32, respectively. That is, one end of each choke coil 30 or 32 extends to an associated terminal 29 or 31. The other ends of the above coils 30 and 32 commonly extend to a capacitor 34 mounted to the box filter's side wall of the microwave oscillator. In order to absorb operational noise, ferrites 30*a* and 32*a* are axially inserted in the coils 30 and 32, respectively.

Top and bottom magnetic pole pieces 33 and 35 having a funnel-shaped configuration are welded to the top and bottom edges of the anode cylinder 13, respectively. The above pole pieces 33 and 35 form a magnetic path inside the anode cylinder 13 and thereby form a uniform magnetic field inside the space 12.

Tightly welded to the top and bottom surfaces of the above pole pieces 33 and 35 are top and bottom shield cups 37 and 39. In order to seal and vacuumize the anode cylinder 13, antenna and insulating ceramics 45 and 27 are tightly welded to the top and bottom edges of the above shield cups 37 and 39, respectively.

Fitted over the top and bottom shield cups 37 and 39 are annular magnets 41 and 43. The above magnets 41 and 43 cause the magnetic field to be uniformly distributed inside the anode cylinder 13. The top shield cup 37 constitutes the output part of the microwave oscillator. The cylindrical antenna ceramic 45 is welded to the top edge of the above cup 37 and insulates an antenna cup which will be described later herein.

An exhaust pipe 47 formed of copper is attached to the top of the above cylindrical antenna ceramic 45. An antenna 49 extends from the vanes 15 and passes through a hole of the top pole piece 33 and in turn axially extends inside the ceramic 45 and exhaust pipe 47 prior to being fixed to the bulged top of the above pipe 47. The above antenna 49 outputs the microwaves generated from the resonance cavities defined between the vanes 15.

The above pipe 47 in turn is covered with an antenna cap 51. This antenna cap 51 protects the welded portion of the pipe 47, prevents sparks caused by electrostatic focusing, acts as a microwave antenna and acts as a window for outputting the microwaves to the exterior of the microwave oscillator.

The anode cylinder 13 is surrounded by top and bottom yokes 53 and 55. The above yokes 53 and 55 set the amount of magnetic flux inside the cylinder 13 to connect feedback flux. A plurality of regularly-spaced cooling fins 57 formed of aluminum are axially fitted over the cylinder 13 inside the bottom yoke 55. The above fins 57 are clamped by a plurality of clamps 55*a* provided on the side wall of the yoke 55. The anode cylinder 13, annular magnets 41 and 43 and cooling fins 57 are commonly surrounded by the top and bottom yokes 53 and 55 which also form a magnetic path.

As shown in FIGS. 2 and 3, the distance from the central axis of the filament 17 to the free ends of the vanes 15 is let be $r_a$, while the radius of the filament 17 is let be $r_c$.

In the operation of the above microwave oscillator, the first and second contact terminals 29 and 31 are applied with electric power, thus forming a closed circuit comprising first contact terminal 29—first cathode support 23—top end hat 20—filament 17—bottom end hat 21—second cathode support 25—second contact terminal 31. The filament 17 is thus applied with an actuating voltage to be turned on and heated.

When the filament 17 is heated, it starts to emit thermions into the space 12 inside the anode cylinder 13.

In the above state, the actuating voltage applied to both the second cathode support 25 and the anode 16 of the oscillator forms an intensive electric field inside the space 12 defined between the filament 17 and vanes 15. The above electric field is applied from the vanes 15 to the filament 17.

Meanwhile, the magnetic flux generated from the annular magnets 41 and 43 is distributed inside the magnetic circuit, which is constructed of the yokes 53 and 55, pole pieces 33 and 35 and space 12. The density of the magnetic flux inside the space 12 is thus increased.

Accordingly, the thermions emitted from the filament 17 into the space 12 originally move toward the vanes 15 or toward the anode cylinder 13 by the intensive electric field inside the space 12. That is, the thermions intend to move radially inside the space 12. The thermions in the above state are also forced to a direction perpendicular to the radial direction inside the space 12 by the high density magnetic flux inside the space 12, thus originally moving toward the anode 16. In this regard, the thermions emitted from the filament 17 revolve inside the space 12.

In the above state, the force applied to the thermions by the electric field inside the space 12 is almost balanced with the force applied to them by the magnetic flux density in that space 12.

While the thermions revolve in the space 12, the thermions cooperate with a resonator 10 inside the anode 16 thereby inducing a radio frequency (RF) electromagnetic field in the resonator 10.

The thermions in the above state convert the potential energy into the kinetic energy. The thermions in turn convert about 70% of the above kinetic energy into RF electromagnetic field energy, while causing the remaining kinetic energy to strike against the vanes 15. The remaining kinetic energy is thus converted into the thermal energy.

The RF electromagnetic field energy generated inside the resonator 10 in the above state is outputted to the exterior of the oscillator from the antenna 49. When 4 KV of actuating voltage Va are applied to opposite ends of an emitter 19 and vanes 15, the above microwave oscillator has a high operational efficiency of not less than 70%.

In microwave ovens with oscillators, it has been noted that the actuating voltage Va for the microwave oscillators is preferred to be reduced to a minimum level as the low actuating voltage Va can provide several advantages in view of the operational stability and cost of the oscillator. That is, such a low actuating voltage Va structurally improves the oscillator, reduces the cost of the power supply circuit, reduces operational noise, saves money caused by the insulating circuits and improves the operational efficiency of the oscillator.

The actuating start voltage Vst for the above microwave oscillator, that is, the voltage for causing the filament 17 to initially emit the thermions, will be represented by the following equation (1) in accordance with the Hartree Equation.

$$Vst=|(w_H \cdot w \cdot ra^2 \cdot m)/(e \cdot n)| \cdot \{1-(rc^2/ra^2)\}-W^2 \cdot rc^2 \cdot m/n^2 \quad (1)$$

wherein $w_H=(e \cdot B)/m$ $w=2\pi f$ (f: actuating frequency)

n (=N/2): half of the number of vanes ra: distance from the filament's central axis to the free ends of the vanes e: amount of thermion's electric charge ($1.62\times10^{-19}$ coulomb)

m: mass of thermion

Typically, $w_H$ is about 1.3–2 w, while the actuating start voltage Vst for the oscillator operating by the voltage of 550 V is 12–20 V.

From the above equation (1), it is noted that the actuating start voltage Vst for the microwave oscillator may be reduced by either increasing the number N of the vanes 15 or reducing the distance ra from the filament's central axis to the free ends of the vanes 15.

However, the increase in the number of the vanes 15 also regrettably causes several problems. That is, the increased number of vanes 15 not only cause a problem while producing the oscillators, they also reduce the operational stability of the oscillators due to the moding in which an oscillator oscillates in one or more undesired modes. In addition, the number N of the vanes 15 in the oscillator operating by the voltage of 550 V must be increased by about 53 times when making the microwave oscillator of 4 KV of actuating voltage be actuated under the low voltage conditions. Such an increase in the number of vanes 15 also regrettably causes the increase in the anode's volume while reducing the operational efficiency of the oscillator.

On the other hand, the reduced distance ra from the filament's central axis to the free ends of the vanes 15 causes the thermions to be easily emitted from the outer edges of the coiled filament 17 thereby preferably reducing the actuating voltage Va for the oscillator. However, the reduced distance ra also increases the drift velocity of the thermions at the moment the thermions reach the vanes 15, thereby regrettably increasing the heat loss and reducing the operational efficiency of the oscillator.

The heat loss or lost thermal energy "Wdiss" according to the increase in the thermion's drift velocity will be represented by the following equation (2).

$$Wdiss=m \cdot v^2/2 \quad (2)$$

wherein m: mass of thermion v: thermion's drift velocity

The ratio of converting the thermion's potential energy into the RF electromagnetic field energy or the electronic efficiency $\eta_e$ will be represented by the following equation (3).

$$\eta_e=1-[Wdiss/(e \cdot Va)] \quad (3)$$

wherein e: amount of thermion's electric charge va: actuating voltage

From the above equations (2) and (3), it is apparent that the thermion's drift velocity is increased to enlarge the loss while reducing the operational efficiency of the oscillator when the distance ra is reduced.

Accordingly, in the above oscillator with the actuating voltage Va of 4KV, the operational efficiency will be reduced to a level of not higher than 55% when the actuating voltage Va is reduced.

SUMMARY OF THE INVENTION

It is, therefore, an object of the present invention to provide a structurally improved microwave oscillator in which the above problems can be overcome and which is provided with an M-type interdigital slow wave resonator structure, thus achieving a high operational efficiency of not less than 70% under the low actuating voltage conditions. In the oscillator of this invention, the term "M-type" means a forward wave-type in that the magnetic field is applied to the electrons in the direction perpendicular to the electron moving direction or to the electric field acting direction, while the term "interdigital" means an engagement of the vanes like one's hands clasped so as to link the fingers of both hands.

In order to accomplish the above object, the preferred embodiment of the present invention provides a microwave oscillator comprising a filament adapted for generating high temperature heat when it is applied with electricity through a pair of cathode supports, an anode surrounding the filament with an actuating space formed therebetween and adapted for generating microwaves, and an antenna adapted for leading the microwaves of the anode to the exterior of the oscillator, wherein the anode includes a top resonance disc provided with a plurality of downward extending vanes and adapted for defining an upper resonance chamber of a resonator, a bottom resonance disc is provided with a plurality of upward extending vanes and adapted for defining a lower resonance chamber of the resonator, and a middle resonance disc placed between the top and bottom resonance discs to separate the upper and lower resonance chambers from each other. The above oscillator further comprises an emitter placed between the filament and the anode and adapted for emitting thermions into the actuating space when the emitter is heated by the filament.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
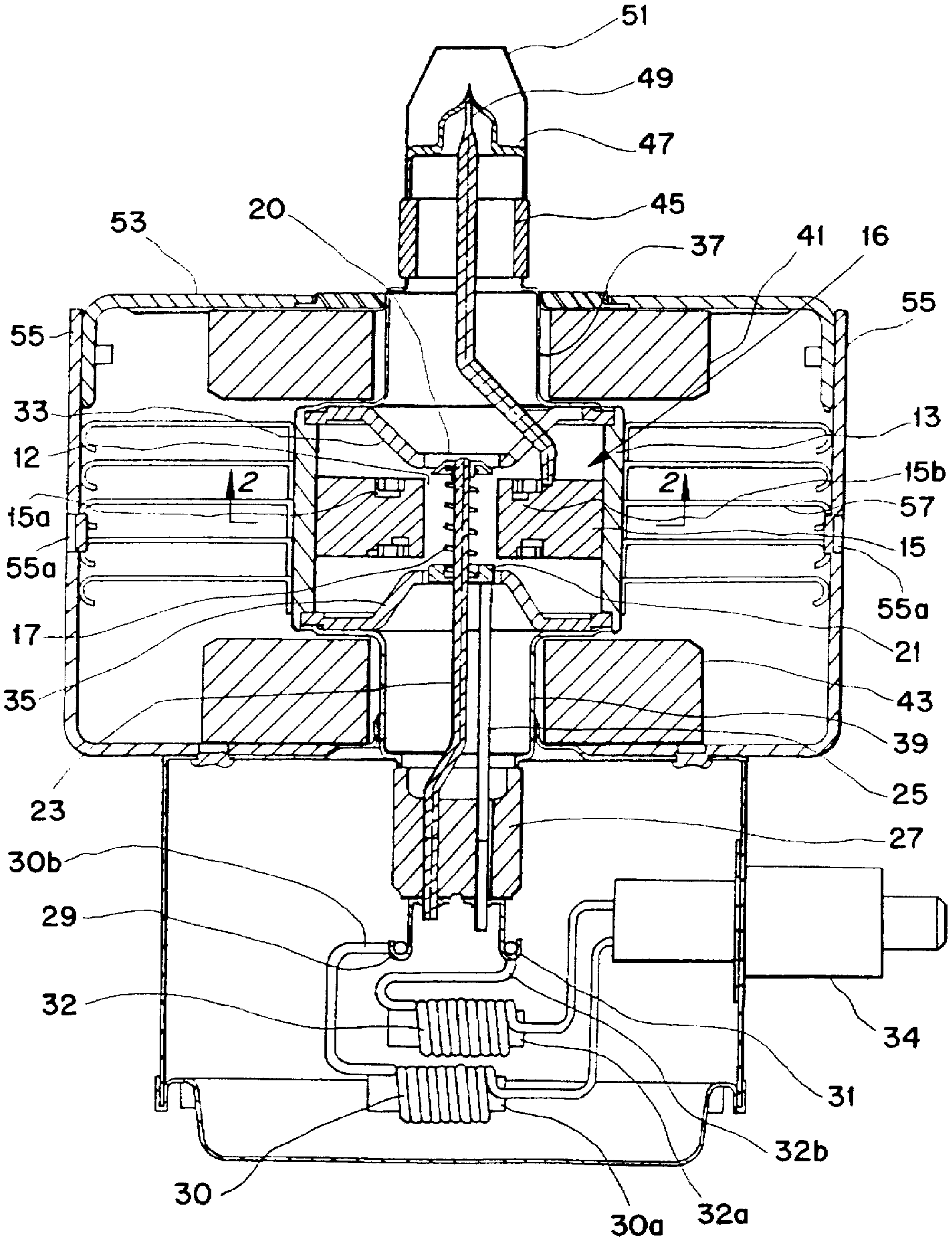
FIG. 1 (PRIOR ART)
FIG. 1 is a sectional view showing the construction of a typical microwave oscillator.
Figure 2:
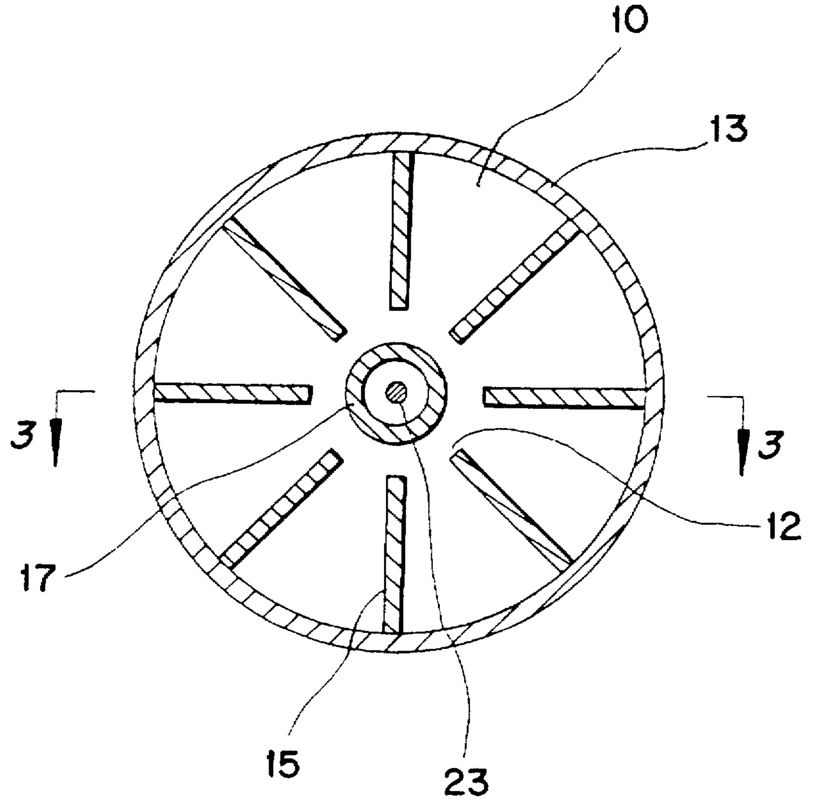
FIG. 2 (PRIOR ART)
FIG. 2 is a sectional view taken along the section line A—A of FIG. 1, showing the positional relation between the filament and vanes inside an anode cylinder.
Figure 3:
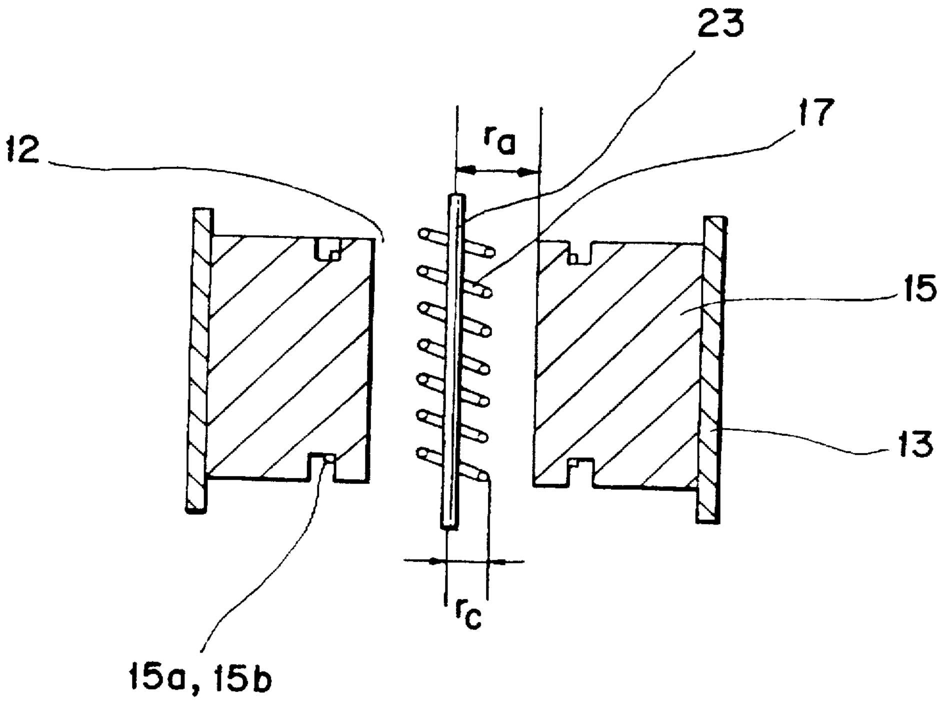
FIG. 3 (PRIOR ART)
FIG. 3 is a sectional view taken along the section line B—B of FIG. 2, showing the uniform distances from the filament's central axis to the outer edges of the coiled filament and to the free ends of the vanes.

FIGS. 4 to 10 show a microwave oscillator and its elements in accordance with a preferred embodiment of the present invention. Most of the elements of the embodiment according to this invention are common with those of the prior art embodiment. Therefore, in FIGS. 4 to 10, the same elements as those in the prior art embodiment are denoted by the same reference numerals as those in the prior art embodiment and description thereof is omitted.

Figure 4:
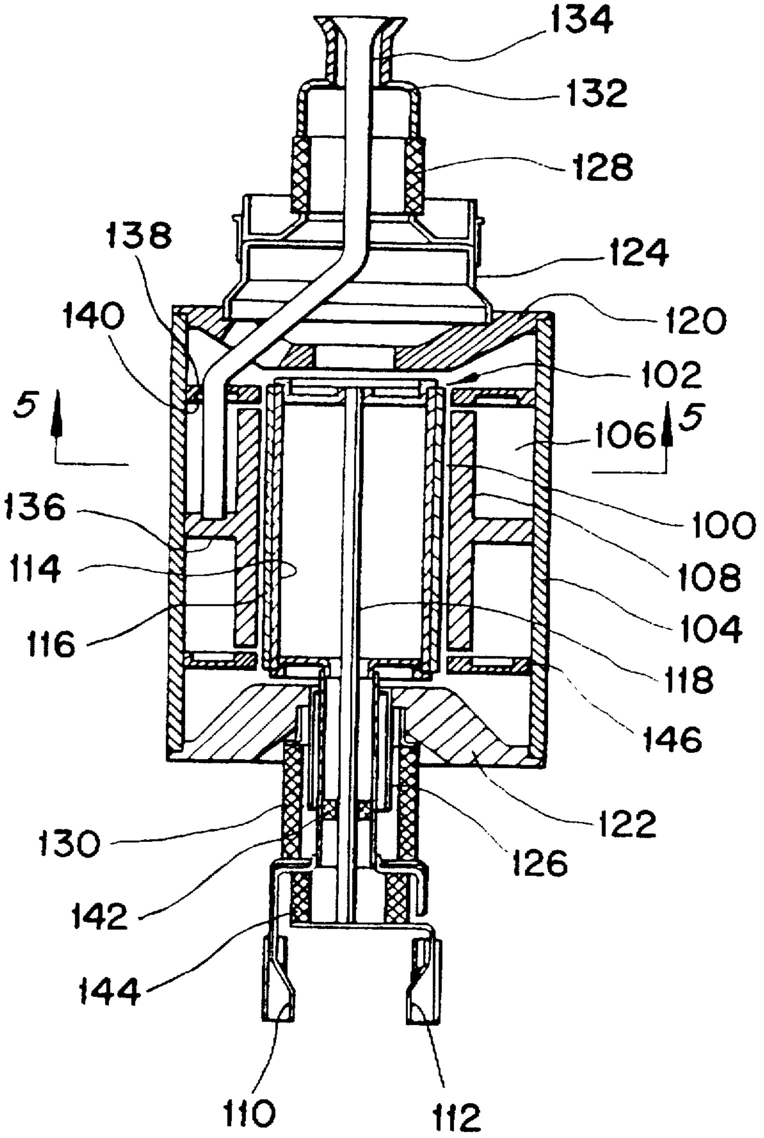
FIG. 4 is a sectional view showing the construction of a microwave oscillator in accordance with a preferred embodiment of the present invention.
Figure 5:
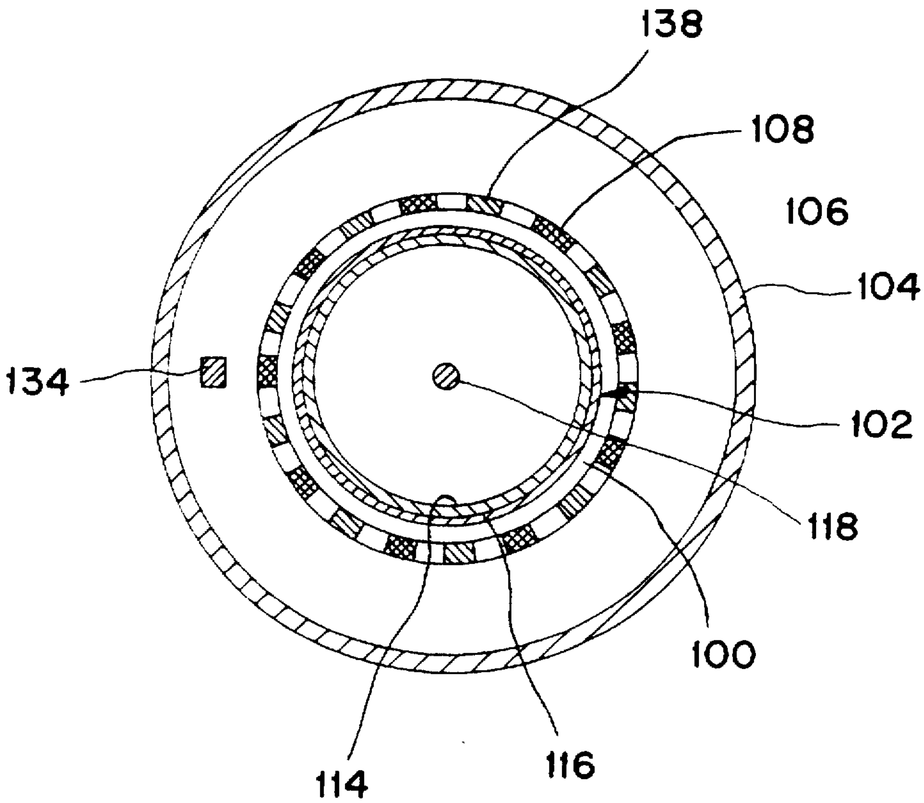
FIG. 5 is a sectional view taken along the section line C—C of FIG. 4, showing the positional relation between the filament, emitter and vanes inside an anode.

As shown in FIGS. 4 and 5, the cathode 102 and anode 104 in the oscillator according to this invention are concentrically arranged with an actuating space 102 formed therebetween. The above anode 104 is a cylindrical body with a resonator 106. The resonator 106 cooperates with the electrons moving inside the actuating space 100, thus forming a radio frequency (RF) electromagnetic field inside the space 100. The above resonator 106, which is defined between a plurality of vanes 108, 148 and 150, anode 104 and top and bottom resonance discs 138 and 146, is partitioned by a middle resonance disc 136 into two resonance chambers, that is, upper and lower resonance chambers. The above middle resonance disc 136 integrally extends horizontally between the vanes 108 and the anode 104.

The cathode 102 includes a coiled or plate-type filament 114. The above filament 114 is connected to first and second outside contact terminals 110 and 112 and generates high temperature heat when it is applied with electricity through the above terminals 110 and 112. The above cathode 102 also includes a cylindrical emitter 116. The emitter 116 surrounds the filament 114 and is integrated with the filament 114 into a single body, thus emitting the thermions into the space 100 when it is heated by the filament 114. The cathode 102 further includes a pair of cathode supports 118. The cathode supports 118 not only supply electricity to the filament 114, it also support the emitter 116 integrated with the filament 114.

The above cathode 102 is produced in the following process. That is, $BaOY_2O_3S_2O$ is thermally dissolved in strontium+barium oxide prior to being powdered. The resultant powder in turn is added into acetate and formed into a cover using a bond. The resultant cover in turn is sprayed onto the cathode 102, thereby covering the cathode 102. In order to improve the secondary electron emission in the oscillator, the electrons are generated through a thermion emission which is performed with a cathode using cold $ThO_2$ added with 0.25% of tungsten (W). In the above process, the temperature is only slightly raised. The previously emitted electrons return to their original positions, thus being brought into collision against the other electrons and thereby exciting the other electrons. Secondary electrons are thus generated and practically used in the oscillator.

Top and bottom magnetic pole pieces 120 and 122 having a funnel-shaped configuration are welded to the top and bottom edges of the anode 104, respectively. The above pole pieces 120 and 122 form a magnetic path inside the anode 104 and thereby form a uniform magnetic field inside the space 100 defined between the emitter 116 and the vanes 108, 148 and 150.

Tightly welded to the top and bottom surfaces of the above pole pieces 120 and 122 are top and bottom shield cups 124 and 126. In order to seal and vacuumize the anode 104, antenna and insulating ceramics 128 and 130 are tightly welded to the top and bottom edges of the above shield cups 124 and 126, respectively.

The top shield cup 124 constitutes the output part of the microwave oscillator. The cylindrical antenna ceramic 128 is welded to the top edge of the above cup 124 and insulates an antenna 134 which will be described later herein. Attached to the top of the above antenna ceramic 128 is an exhaust pipe 132 formed of copper.

The antenna 134 extends from the vanes and passes through a hole of the top pole piece 120 and in turn axially extends inside the ceramic 128 and exhaust pipe 132 prior to being fixed to the top of the above pipe 132 at one end thereof. The above antenna 134 outputs the microwaves generated from the resonator 106 which is defined between the vanes and the anode 104. The other end of the above antenna 134 is connected to the middle resonance disc 136. The above antenna 134 passes the top resonance disc 138, so the disc 138 is provided with a hole 140 for stably holding the antenna 134.

At a portion under the bottom pole piece 122, a cylindrical first insulating ring 142 is fitted in the gap between the filament 114 and the cathode support 118, thus insulating the filament 114 from the support 118. A cylindrical second insulating ring 144 is provided under the above first ring 142 to insulate the cathode support 118 from the first contact terminal 110 and thereby to let the cathode support 118 be connected to the second contact terminal 112 exclusively.

Figure 7:
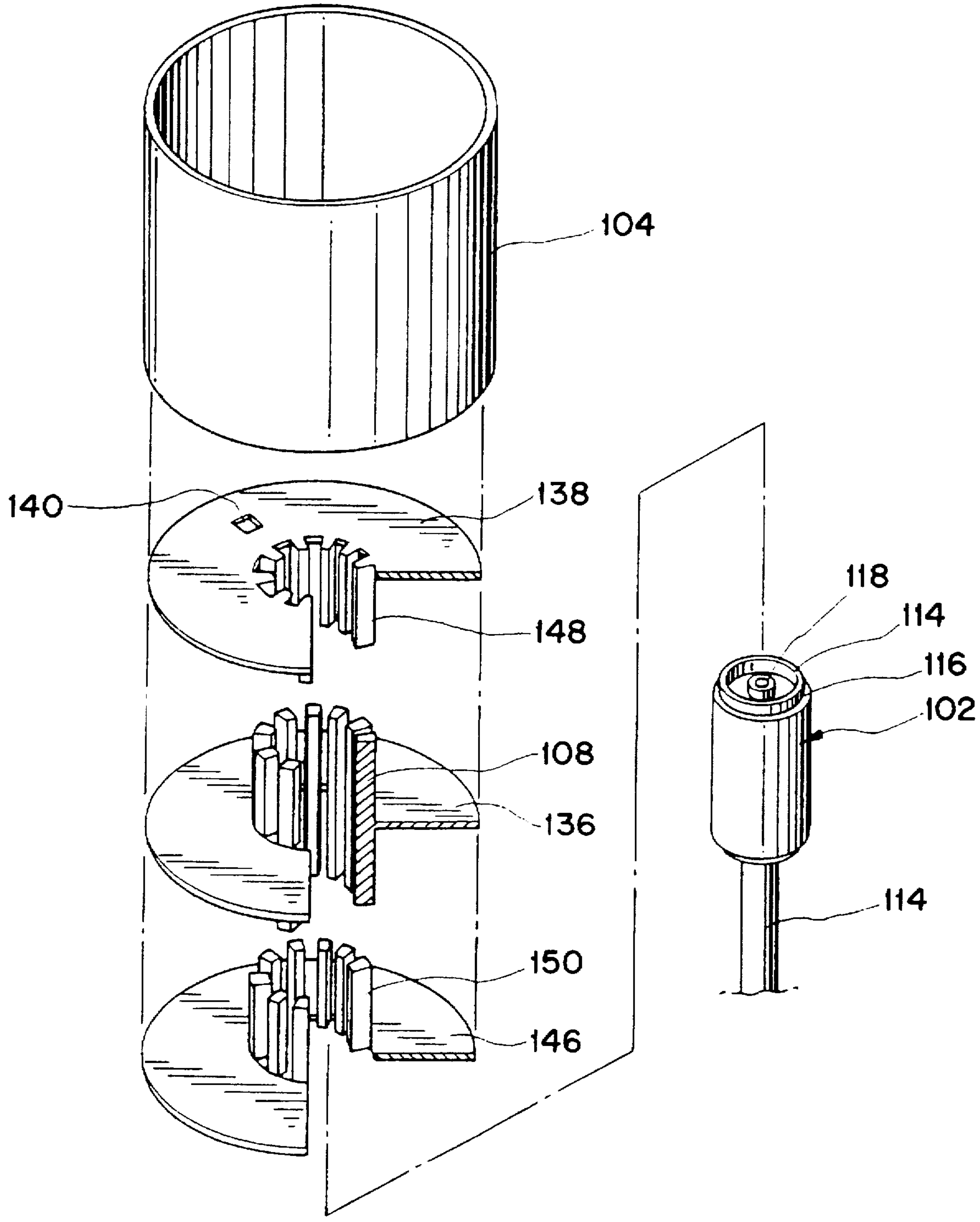
FIG. 7 is an exploded perspective view showing the construction of the anode of the oscillator according to this invention.
Figure 8:
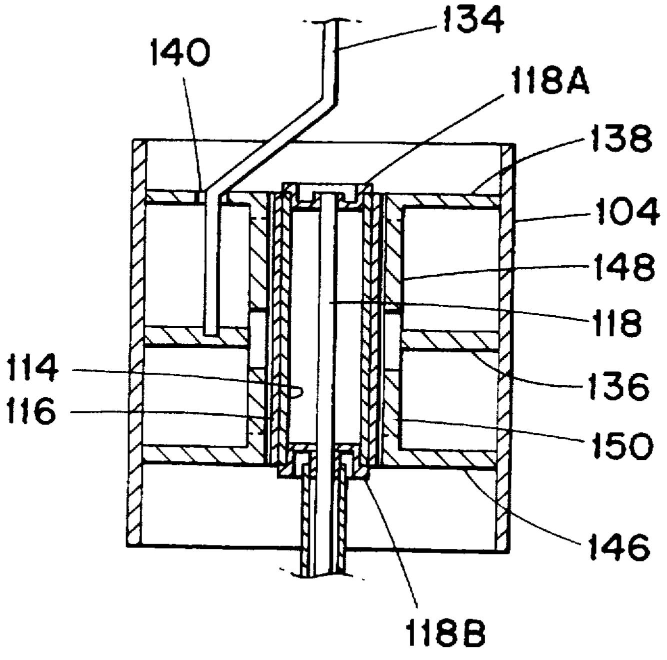
FIG. 8 is a sectional view showing the coupling between the antenna and the resonator in the oscillator according to this invention.

FIGS. 7 and 8 show the construction for forming the resonator 106 inside the anode 104. In order to form the resonator 106, comprising two resonance chambers, inside the anode 104, the top resonance disc 138 with a plurality of downward extending vanes 148 is horizontally arranged in the upper section inside the anode 104. The above top disc 138 defines the upper resonance chamber of the resonator 106. The lower resonance chamber of the resonator 106 is defined by the bottom resonance disc 146. The above bottom disc 146 is provided with a plurality of upward extending vanes 150 and is horizontally arranged in the lower section inside the anode 104. The top and bottom discs 138 and 146 with the vanes 148 and 150 have the same configuration but their vanes 148 and 150 extend in opposite directions. In the above top and bottom discs 138 and 140, the corresponding vanes 148 and 150 are positioned in the same places.

The above upper and lower resonance chambers of the resonator 106 are separated from each other by the middle resonance disc 136 which is horizontally arranged in the middle section between the top and bottom discs 138 and 146. The above middle disc 136 is provided with the upward and downward extending vanes 108.

Figure 9:
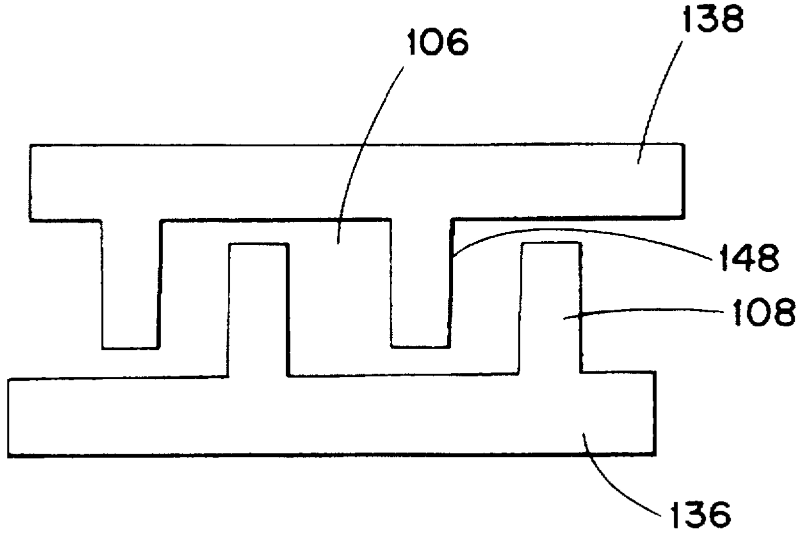
FIG. 9 is a view of the vanes looked from the cathode, showing the interdigital type delay system of the resonator in the oscillator according to this invention.

Each set of corresponding vanes 108 of the above middle disc 136 oppositely extend from the same position of the inside edge of the disc 136. The upward extending vanes 108 of the middle disc 136 and the vanes 148 of the top disc 138 do not come into contact with each other but are alternately arranged. In the same manner, the downward extending vanes 108 of the middle disc 136 and the vanes 150 of the bottom disc 146 do not come into contact with each other but are alternately arranged. That is, the vanes 108 of the middle disc 136 engage with the vanes 148 and 150 of the top and bottom vanes 138 and 146 into the interdigital structure like one's hands clasped so as to link the fingers of both hands. For example, the interdigital structure of the vanes 108 and 148 of the discs 136 and 138 is shown in FIG. 9.

Figure 10:
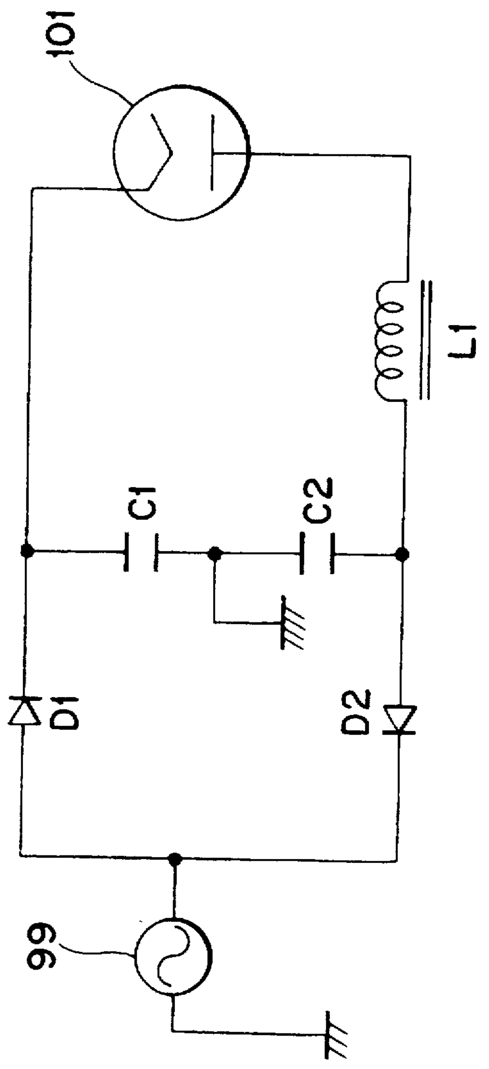
FIG. 10 is a diagram showing the circuit for supplying electricity to the oscillator of the present invention.

FIG. 10 shows a circuit for supplying electricity to the above microwave oscillatcr. The above circuit comprises a first diode D1 and capacitor C1 for rectifying the positive AC voltage supplied from an AC power supply source 99. The circuit also comprises includes a second diode D2 and capacitor C2 for rectifying the negative AC voltage supplied from the source 99. The above circuit further comprises a protection coil L1 for matching the impedance inside the circuit and protecting the oscillator 101.

The operational effect of the above oscillator will be described hereinbelow.

In the above oscillator, the resonator 106 inside the anode 104 has an M-type interdigital slow wave structure. In the resonator 106, the term "M-type" means a forward wave-type in that the magnetic field is applied to the electrons in the direction perpendicular to the electron moving direction or to the electric field acting direction. The term "interdigital" means an alternately-arranged vane structure like one's hands clasped so as to link the fingers of both hands.

In an oscillator which generates the microwaves of 2450 MHz under the condition of 600–900 W according to this invention, the number of the vanes 108, 148 and 150 is ranged from 24 to 30, while the height of each vane 108, 148 or 150 is about 20 mm. The radius of the anode 104 is about 4.5 mm.

The intensity of the magnetic field for deflecting the electrons inside the space 100 is 1200–1300 Gauss. Each interval between the vanes is about 1 mm.

In the low voltage microwave oscillator of this invention, it is impossible to use a cathode of the 4 KV type, which is a mixed and sintered body of W-$ThO_2$ and has been typically used with a conventional microwave oven.

The above conclusion is caused by the fact that the anode current in the oscillator is in reverse proportion to the actuating voltage for the oscillator. That is, the anode current is increased as the actuating voltage is reduced. As low voltage microwave oscillator requires an electric current of 3–4 A, the sectional area of the cathode must be enlarged by 3 $cm^2$. The filament 114 in the above oscillator must be applied with electric power of about 200 W.

Accordingly, the oscillator of this invention emits electrons through the thermion emission. The previously emitted electrons return to their original positions, thus coming into collision against the other electrons and thereby generating secondary electrons which will be practically used in the oscillator. In this regard, the oscillator of this invention uses a cathode formed of cold $Tho_2$.

Meanwhile, the power P which sets the output power of the microwave oscillator can be represented by the following equation (4).

$$P=w\cdot W/Q \quad (4)$$

wherein w=2 πf (f: actuating frequency)

W: stored energy

Q: quality factor of dividing the lost thermal energy "Wdiss" by the stored energy "W".

The above stored energy W can be represented by the following equation (5).

$$W=V^2\cdot C\cdot N \quad (5)$$

wherein

N: number of vanes

C: capacitance

V: radio frequency voltage

When substituting the equation (5) for the equation (4), the output power factor P of the oscillator can be represented by the following equation (6).

$$P=w\cdot V^2\cdot C\cdot N/Q \quad (6)$$

From the above equation (6), it is possible to set the relative factor for reducing the actuating voltage for the oscillator. That is, in the low voltage microwave oscillator of the 550V type, the number N of the vanes 108, 148 and 150 is increased to 24, which is increased by 2.4 times in comparison with that of the typical oscillator of the 4KV type. In addition, the quality factor Q becomes 30, which is reduced by 6.7 times in comparison with that of the typical oscillator of the 4KV type. The capacitance C is almost increased twice. In this regard, the present invention can provide an oscillating tube suitable for being used with a typical microwave oscillator.

In accordance with the present invention, the resonator structure of the oscillating tube is preferably designed into the interdigital structure with a reasonable capacitance as shown in FIGS. 4 to 9.

The above interdigital resonator structure not only causes a reasonable capacitance in a narrow space, it also forms at least one resonator inside the anode, thus successfully improving the output of the microwave oscillator under the low voltage conditions.

In the operation of the above microwave oscillator, a low voltage is applied to both the anode 104 and the cathode 102 through the first and second contact terminals 110 and 112. The filament 114 is thus applied with the actuating current thereby being heated.

When the filament 114 is heated as described above, the emitter 116 which integrally surrounds the filament 114 receives the thermal energy from the filament 114 and starts to emit thermions into the actuating space 100.

In the above state, an intensive electric field is formed inside the space 100, which is defined between the emitter 116 and the vanes 108, 148 and 150, by the actuating voltage applied to both the cathode 102 and the anode 104. The intensive electric field in the above state is applied from the vanes 108, 148 and 150 to the emitter 116.

The magnetic flux generated from the magnets 41 and 43 is distributed inside the closed magnetic circuit, which is constructed of the pole pieces 120 and 122 and space 100. The density of the magnetic flux inside the space 100 is thus increased.

Accordingly, the thermions emitted from the heated emitter 116 into the space 100 form an electron group due to the intensive electric field distributed in the space between the cathode 102 and the anode 104. The above electron group in the above state are also forced to a direction perpendicular to the radial direction inside the space 100 by the intensive magnetic flux inside the space 100. The electron group thus receives in the space 100.

When the electron group reaches the middle resonance disc 136 while revolving in the space 100, the disc 136 becomes the positive potential part thus sending electric current to the vanes 148 of the top resonance disc 138. The electron group "a" in the above state moves vertically upward in the resonator 106 inside the anode 104 and revolves in the space 100 as shown in FIG. 6.

Figure 6:
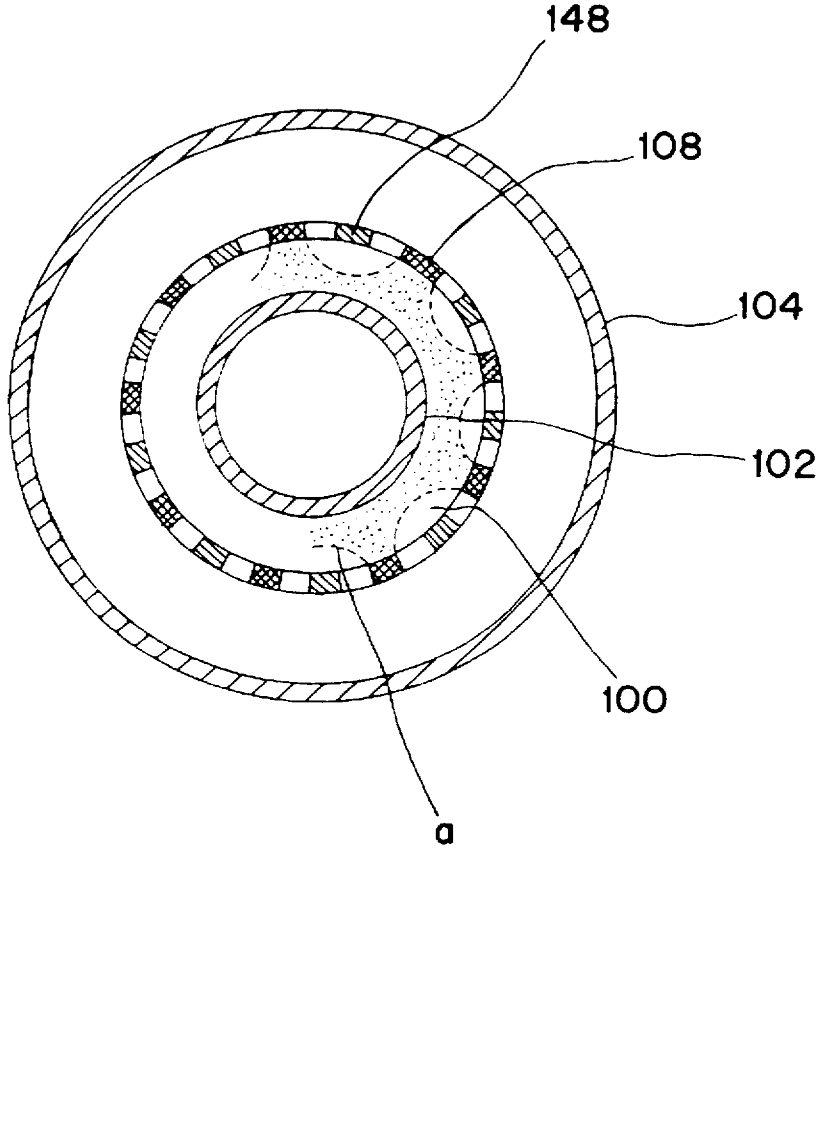
FIG. 6 is a sectional view taken along the section line C—C of FIG. 4, showing the formation of an electron group inside the actuating space.

In FIG. 6, the actuating space 100 between the cathode 102 and the vanes 108 and 148 is shown in the enlarged scale to show the formation of the electron group "a" inside the space 100 in detail.

Accordingly, the microwaves of about 2450 MKz are generated in the resonator 106 due to the electronic action in the space between the vanes 108 and 148. The microwave energy stored in the resonator 106 acts in the type of periodically repeated energy through the wall of the resonator 106.

In addition, the middle resonance disc 136 is the concentration area of the energy generated in the upper and lower resonance chambers, so the antenna 134 preferably extends frcm the middle disc 136 to output the microwaves.

In order to hold the antenna 134, extending upward from the middle disc 136, in the top disc 138 while passing the antenna 134 to the exterior of the oscillator through the exhaust pipe 132, the above top disc 138 is provided with the antenna coupling hole 140.

In the above oscillator, the electron group "a" that is formed in the space 100 by the thermions emitted from the cathode 102 as shown in FIG. 6 must effectively act in the resonating system. In order to achieve the above object, it is required to provide the conditions for synchronization between the electron group "a" and the microwave electric field.

As shown in FIG. 6, the conditions for synchronization are achieved by allowing the electron group "a" to completely pass the two resonance chambers 106 during one oscillating period as represented by the following equation (7).

$$v=2d/T,\ \text{here}\ T=1/f,\ \text{so}\ v=2df \qquad (7)$$

wherein v: velocity of electron group moving in the resonator d: resonating period T: oscillating period f: oscillating frequency In the oscillator of this invention, the velocity v of the electron group "a" is represented by the equation, $v=(2eVc/m)^{1/2}$, so the synchronous voltage vc for the oscillator can be represented by the equation, $Vc=2d^2f^2m/e$, resulting from substituting the equation, $v=(2eVc/m)^{1/2}$, for the equation (7).

Accordingly, the maximum electronic efficiency $\eta_{emax}$ can be represented by the following equation (8).

$$\eta_{emax}=1-(Vc/Va) \qquad (8)$$

In the above equation (8), Va is the anode voltage of the oscillator, so the following conditions must be achieved in order to obtain the appropriate electronic efficiency $\eta_e$.

Vc/Va=10

From the above conditions, it is possible to set the synchronous voltage Vc for the low voltage microwave oscillator. It is also possible to know that the synchronous voltage Vc for the low voltage microwave oscillator of the 550V type must be about 50V. The resonating period in the above conditions is about 0.7–0.8 mm.

Accordingly, it is noted that to design the low voltage microwave oscillator in a conventional manner is almost impossible due to difficulty in mode setting. In order to overcome the above problem, it is required to provide a resonating system with a single resonator. The above resonating system must be equipped with a delay system shown in FIG. 9.

The radial resonator 106 shown in FIG. 9 performs a π-mode oscillation under the conditions of minimum oscillating mode, constant electric field of the tangent type and apposite phase of the vanes 108 and 148 in the delay system.

In the case of magnetic field of the tangent type, the electric field is exactly orientated axially, while the coupling between the antenna 134 and the resonator 106 is achieved by a magnetic loop as shown in FIG. 8.

As described above, the present invention provides a structurally improved microwave oscillator. In the above oscillator, the resonating system has an M-type interdigital slow wave resonator structure. As the resonator structure of this invention is the "M-type" or "forward wave-type" structure, the magnetic field is applied to the electrons in the direction perpendicular to the electron moving direction or to the electric field acting direction. In addition, the vanes in the cathode of the above oscillator are alternately arranged to form the "interdigital" resonator structure like one's hands clasped so as to link the fingers of both hands. Due to the above M-type interdigital slow wave resonator structure, the oscillator of this invention achieves a high operational efficiency of not less than 70% under the low actuating voltage conditions.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A microwave oscillator comprising a filament adapted for generating high temperature heat when it is applied with electricity through a pair of cathode supports, an anode surrounding said filament with an actuating space formed therebetween and adapted for generating microwaves, and an antenna adapted for leading said microwaves of the anode to the exterior of said oscillator, wherein the improvement comprises:

said anode including:

a top resonance disc provided with a plurality of downward extending vanes and adapted for defining an upper resonance chamber of a resonator;

a bottom resonance disc is provided with a plurality of upward extending vanes and adapted for defining a lower resonance chamber of said resonator; and a middle resonance disc placed between said top and bottom resonance discs to separate said upper and lower resonance chambers from each other; and an emitter placed between said filament and said anode and adapted for emitting thermions into said actuating space when said emitter is heated by said filament.

2. The microwave oscillator according to claim 1, wherein said emitter is formed of cold $ThO_2$, which primarily emits electrons through a thermion emission and causes the primarily emitted electrons to excite other electrons to generate practically used secondary electrons when the primarily emitted electrons return to their original positions, thereby allowing said emitter to be operated at a low actuating voltage.

3. The microwave oscillator according to claim 1, wherein said anode has an interdigital resonator structure that is provided with a plurality of vanes while forming only one resonator.

4. The microwave oscillator according to claim 1, wherein said anode has a radius ranged from 4.0 mm to 5.0 mm, thereby being operated at a low actuating voltage.

5. The microwave oscillator according to claim 3, wherein the number of said vanes is ranged from 22 to 30 thereby allowing said vanes to be operated at a low actuating voltage.

6. The microwave oscillator according to claim 3, wherein the vanes of each resonance disc have a height of 20±3 mm and are spaced out at an interval ranged from 0.6 mm to 1.0 mm.

7. The microwave oscillator according to claim 1, wherein said top resonance disc is provided with a hole for passing and holding said antenna.

8. The microwave oscillator according to claim 1, wherein said bottom resonance disc has the same configuration as said top resonance disc when said top resonance disc is turned over, and the vanes of said top and bottom resonance discs extend from corresponding positions.

9. The microwave oscillator according to claim 1, wherein said middle resonance disc has a plurality of upward extending vanes engaging with said downward extending vanes of the top resonance disc in the type of interdigital engagement like one's hands clasped so as to link the fingers of both hands.

10. The microwave oscillator according to claim 1, wherein said middle resonance disc has a plurality of downward extending vanes engaging with said upward extending vanes of the bottom resonance disc in the type of interdigital engagement like one's hands clasped so as to link the fingers of both hands.

11. The microwave oscillator according to claim 1, wherein said antenna extends from said middle resonance disc and outputs microwave energy to the exterior of said oscillator.

12. The microwave oscillator according to claim 5, wherein the number of said vanes is set in accordance with both a quality factor and a capacitance in an interdigital gap in an interdigital resonator structure like clasped hands.

* * * * *